(12) United States Patent
Ben Mohamed et al.

(10) Patent No.: US 8,003,493 B2
(45) Date of Patent: Aug. 23, 2011

(54) METHOD OF SPLITTING A SUBSTRATE

(75) Inventors: Nadia Ben Mohamed, Echirolles (FR); Sébastien Kerdiles, Saint-Ismier (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/676,320

(22) PCT Filed: Oct. 21, 2008

(86) PCT No.: PCT/EP2008/064200
§ 371 (c)(1),
(2), (4) Date: Mar. 3, 2010

(87) PCT Pub. No.: WO2009/053355
PCT Pub. Date: Apr. 30, 2009

(65) Prior Publication Data
US 2010/0176493 A1 Jul. 15, 2010

(30) Foreign Application Priority Data
Oct. 23, 2007 (FR) .................................... 07 58502

(51) Int. Cl.
*H01L 21/30* (2006.01)
(52) U.S. Cl. ........ 438/458; 438/473; 438/514; 438/690; 257/E21.317; 257/E21.318; 257/E21.568
(58) Field of Classification Search .................. 438/120, 438/473, 515, 516, 914, 924; 257/E21.317, 257/E21.319, E21.603
See application file for complete search history.

(56) References Cited

U.S. PATENT DOCUMENTS

| 3,901,423 | A | 8/1975 | Hillberry et al. ................. 225/2 |
| 5,854,123 | A | 12/1998 | Sato et al. ..................... 438/507 |
| 5,863,830 | A | 1/1999 | Bruel et al. .................... 438/478 |
| 6,013,563 | A | 1/2000 | Henley et al. ................. 438/458 |
| 6,020,252 | A | 2/2000 | Aspar et al. ................... 438/458 |
| 2002/0081823 | A1* | 6/2002 | Cheung et al. ................ 438/455 |
| 2003/0134489 | A1 | 7/2003 | Schwarzenbach et al. ... 438/458 |
| 2004/0171233 | A1* | 9/2004 | Ohmi et al. ................... 438/458 |
| 2005/0020030 | A1 | 1/2005 | Nakano et al. ................ 438/455 |
| 2005/0217560 | A1 | 10/2005 | Tolchinsky et al. ............ 117/11 |

FOREIGN PATENT DOCUMENTS

| EP | 1 331 663 B1 | 7/2003 |
| EP | 1 460 691 A1 | 9/2004 |

OTHER PUBLICATIONS

International Search Report, PCT/EP2008/064200, mailed Feb. 6, 2009.

* cited by examiner

*Primary Examiner* — Cheung Lee
(74) *Attorney, Agent, or Firm* — Winston & Strawn LLP

(57) ABSTRACT

A process for splitting a semiconductor substrate having an identification notch on its periphery, by creating a weakened zone in the substrate by implanting atomic species into the substrate while the substrate is held in place on a portion of its periphery during the implanting; and splitting the substrate along the weakened zone by placing the held portion of the substrate in a splitting-wave initiation sector while positioning the notch for initiating a splitting wave followed by the propagation of the wave into the substrate. During splitting the notch is positioned so that it is in a quarter of the periphery of the substrate diametrically opposite the sector for initiating the splitting wave or in the quarter of the periphery of the substrate that is centered on the sector.

11 Claims, 4 Drawing Sheets

METHOD OF SPLITTING A SUBSTRATE

This application is a 371 filing of International Patent Application PCT/EP2008/064200 filed Oct. 21, 2008.

FIELD OF THE INVENTION

The present invention relates to a method of splitting a substrate, in particular one applicable in the fabrication of an SOI (semiconductor-on-insulator) structure by a film transfer process of the SmartCut™ type.

BACKGROUND OF THE INVENTION

In the fabrication of semiconductors, processes based on the bonding of a thin film followed by the transfer of said film onto a substrate are frequently encountered.

In particular, the SmartCut™ process comprises, in a first step, the formation in what is called a donor substrate of a weakened zone defining the boundary of a thin film intended to be transferred onto what is called a receiver substrate.

Then, after the donor substrate has been bonded to the receiver substrate, the donor substrate is split so as to transfer the thin film onto the receiver substrate.

As a general rule, the splitting is initiated at a predetermined point on the periphery of the donor substrate, followed by propagation in the form of a splitting wave into the rest of the substrate. The splitting is initiated for example by means of mechanical forces, by localized heating, etc.

When splitting substrates, which are in the form of circular wafers, it is frequently found that there is a defect, called a "process line" or a "stress line" which is initiated around a notch located on the edge of the wafer.

This notch, which is generally triangular and penetrates about 2 mm (along the diameter of the wafer), enables the orientation of the wafer to be identified during the various steps of the process. The notch, which is made by the wafer manufacturer before the wafer is cut from the ingot, enables the crystal orientation of the substrate to be identified.

A photograph of such a line associated with the notch is shown in FIG. 1. The notch is identified by the reference sign 4 and the process line is surrounded by dots.

From analyses carried out by the Applicant, this line corresponds to the tearing of the thin transverse film, initiated around the notch by localized stresses.

This is an elongate defect characterized by a high roughness over its entire length, generally a through-defect in its most pronounced central part (the transferred film being torn over its entire thickness), so that a chip constructed on top of this line would not operate.

This line is therefore an unacceptable defect leading to the wafer being scrapped if it is observed to have a length greater than a few microns.

A first object of the invention is therefore to improve the process for fabricating a film transfer structure so as to prevent the formation of such a line around the notch on the final structure.

Another object of the invention is to define a method of splitting a substrate that reduces the appearance of a line associated with the notch.

BRIEF DESCRIPTION OF THE INVENTION

For this purpose, the invention provides a process for splitting a semiconductor substrate having an identification notch on its periphery, which process comprises the steps of:

(a) creating a weakened zone in the substrate;

(b) splitting the substrate along the weakened zone, the splitting comprising the initiation, in a predetermined sector on the periphery of the substrate, of a splitting wave followed by the propagation of said wave into the substrate, said process being characterized in that:

the weakened zone created in step (a) is obtained by the implantation of atomic species into the substrate, the substrate being held in place on a portion of its periphery, during the implantation, by a fastening device, in that, during the splitting step (b), said portion is placed in the splitting-wave initiation sector, and in that during step (b) the notch is positioned so that it is in the quarter of the periphery of the substrate diametrically opposite the sector for initiating the splitting wave or in the quarter of the periphery of the substrate centred on said initiation sector.

Said sector in which the notch lies is thus between 135° and 225° or between 315° and 45° to the bisector of the splitting-wave initiation sector.

According to a first embodiment of the invention, during step (b) the substrate is placed in a vertical position in a furnace, so that the splitting-wave initiation sector is centred on the top of the substrate and the notch is located in the lower quarter or in the upper quarter of the substrate.

According to a second embodiment, during step (b) the splitting wave is initiated by means of a mechanical stress applied in the initiation sector.

The splitting-wave initiation sector is preferably a 90° sector.

According to a preferred embodiment of the invention, the process further comprises, between step (a) and step (b) a step of direct bonding of said substrate to a receiver substrate, so that after step (b) the film defined by the weakened zone is transferred to the receiver substrate.

Another subject of the invention relates to a batch of split substrates having an identification notch, characterized in that said batch is obtained by a process as described above, and in that the proportion of substrates having a process line associated with the notch is less than 12%.

BRIEF DESCRIPTION OF THE DRAWINGS

Other features and advantages of the invention will again be apparent from the following detailed description, with reference to the appended figures in which.

DETAILED DESCRIPTION OF THE INVENTION

Although the invention relates to a process of splitting a substrate in general, it will be hereinafter described referring to the case of the fabrication of a semiconductor structure by transferring a film from a substrate (also called, in this context, "donor substrate") to a receiver substrate.

It must be understood, however, that the invention is neither limited to a SmartCut™ process nor involves necessarily a bonding of the substrate to be split to another substrate.

In the SmartCut™ process, prior to splitting, the donor substrate undergoes the following steps:

a) creation of a weakened zone defining a thin film to be transferred onto the receiver substrate. Preferably, this weakened zone is formed by implanting atomic species—for example hydrogen or helium atoms—into the wafer. The definition of the implantation conditions (dose, energy), according to the nature of the substrate and the desired implantation depth, is within the competence of a person skilled in the art; and b) bonding—for example direct bonding (by molecular adhesion)—to the receiver substrate. Surface treatments well known to those skilled in the art may be carried out on the substrates before bonding, in order to increase the bonding energy.

Next, the splitting is carried out along the weakened zone in such a way that the thin film is transferred onto the receiver substrate, the remainder of the donor substrate being recovered, for example to be recycled.

For this purpose, an annealing operation may be carried out or a mechanical force may be applied at a point in the weakened zone.

Under the effect of the temperature or the applied force, the splitting is initiated in a predetermined sector on the periphery of the wafer, and then a splitting wave propagates into the rest of the wafer.

The splitting-wave initiation sector is controlled by a person skilled in the art depending on the means employed for the splitting operation.

Situation in which the Splitting is Initiated by Application of a Force

A first possibility is to initiate the splitting by inserting a blade at one point on the periphery of the weakened zone. It is therefore a person skilled in the art who chooses and therefore directly controls the splitting-wave initiation sector.

Situation in which the Splitting is Initiated by Annealing

Figure 1:
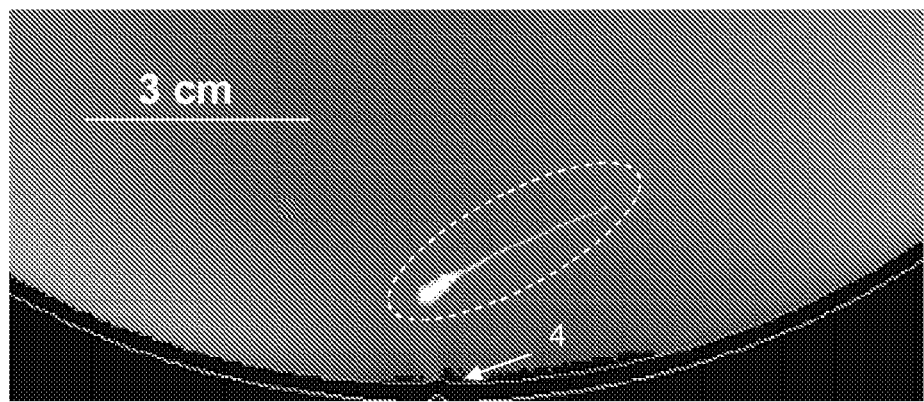
FIG. 1 is a photograph of a process line associated with the notch.
Figure 2:
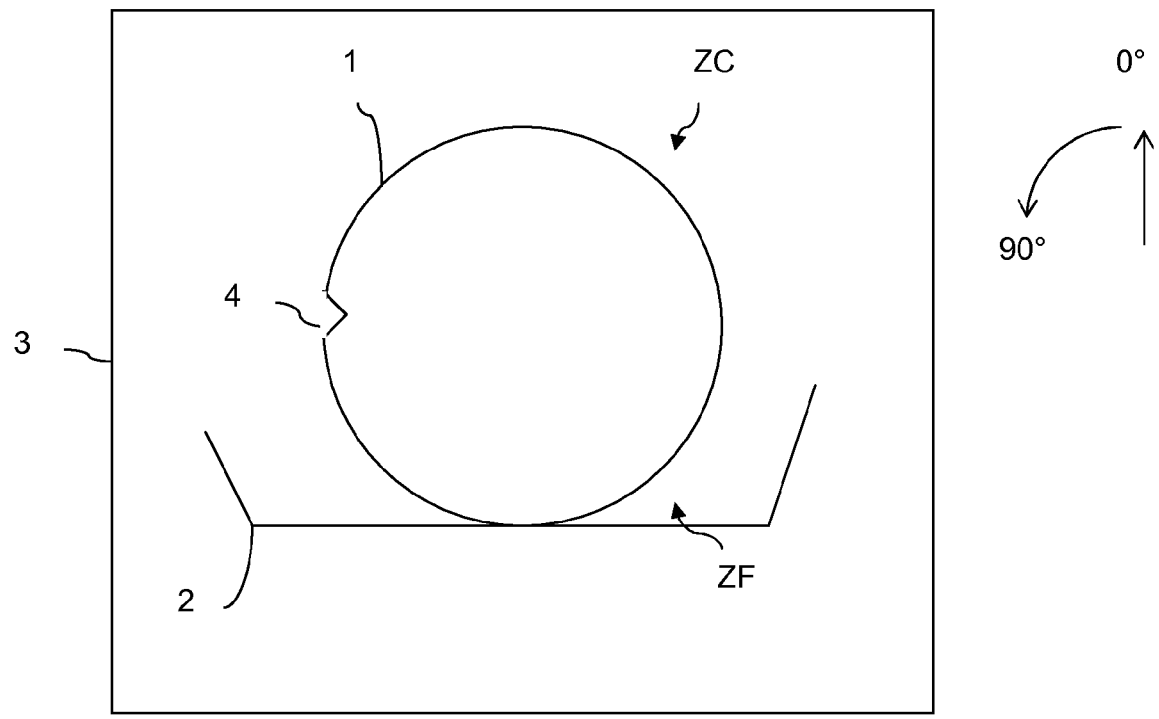
FIG. 2 illustrates schematically a splitting device.
Figure 3:
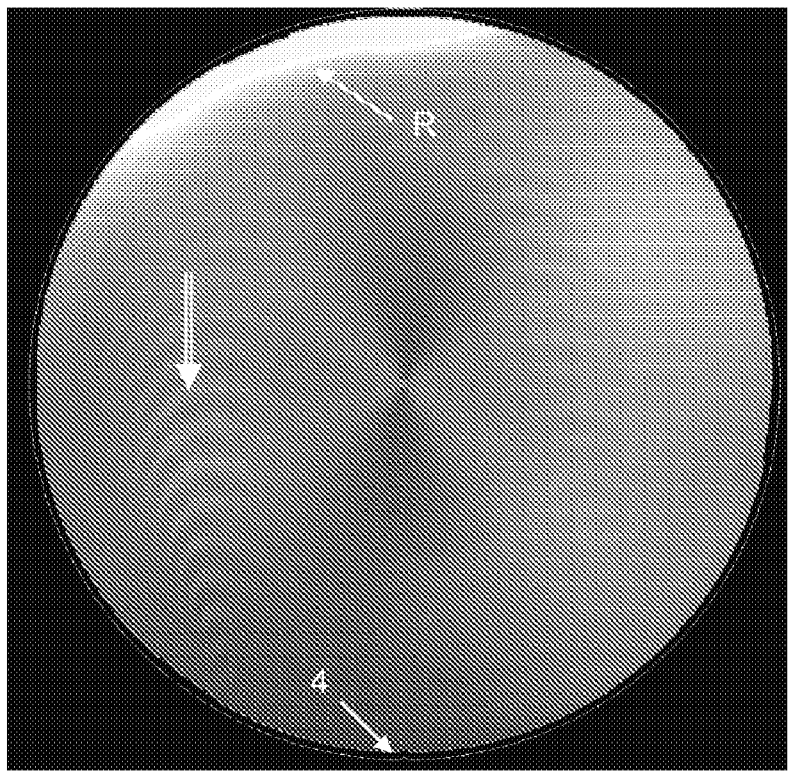
FIG. 3 is a photograph of the front of a splitting-wave initiated in a region diametrically opposite the notch.

In the case of splitting by annealing, a wafer 1 is placed in a vertical position in a boat 2 which can be inserted into a furnace 3, as shown in FIG. 2. The means for keeping the wafer in position are well known to those skilled in the art and will therefore not be described in greater detail.

Usually the wafer 1 is placed in such a way that the notch 4 is oriented at 90° to the vertical (to make it easier to understand the assembly, FIG. 2 has not been drawn to scale).

This orientation of the notch 4 is not imperative, but it does correspond to the position in which the wafers are placed during the previous step of the process, i.e. the bonding step. To avoid handling the wafers, this same orientation is therefore maintained for the splitting step.

The furnace enclosure is brought to the splitting temperature (typically between 300° and 600° C.), by heaters (not shown). These heaters deliver uniform heat into the furnace.

However, that part of the wafer 1 in contact with the boat 2 rises in temperature less easily than the upper part because of a greater mass, which absorbs the heat.

The wafer 1 therefore has what is called a "hot" zone (indicated by the arrow ZC) corresponding approximately to the upper half of the wafer, located away from the boat, and what is called a "cool" zone (indicated by the arrow ZF), corresponding to that part of the wafer 1 located in the boat 2. This corresponds to a temperature gradient of a few tens of degrees Celsius.

The splitting is initiated in the hottest zone of the wafer 1, therefore in a sector R located near the top of the wafer (corresponding in FIG. 2 to a 0° orientation) and propagates in the form of a wave into the wafer.

The expression "near the top" is understood in this text to mean an angular sector R lying between −45° and +45°, more particularly between −20° and +20° and preferably between −5° and +5° with respect to the top of the wafer.

In this case, the splitting-wave initiation sector R is therefore controlled indirectly by the conditions under which the annealing is carried out.

From statistical studies, the initiation of the splitting-wave takes place on average at the top of the wafer, that is to say on the bisector of the sector R.

The Applicant has conducted splitting trials in which the orientation of the notch 4 relative to the boat 2 was varied, the splitting always being initiated in the hot zone of the wafer, that is to say, with reference to FIG. 2, in a sector R centred on a 0° orientation with respect to the vertical.

The Applicant has observed that the formation of the process line associated with the notch 4 is prevented when the notch 4 is located either in a sector oriented at between 135° and 225° with respect to the vertical, that is to say with respect to the bisector of the splitting initiation sector R, or in a sector oriented between 315° (or −45°) and 45° with respect to the bisector of the splitting initiation sector.

This beneficial orientation corresponds in fact to two preferential sectors for positioning the notch 4.

Figure 5A:
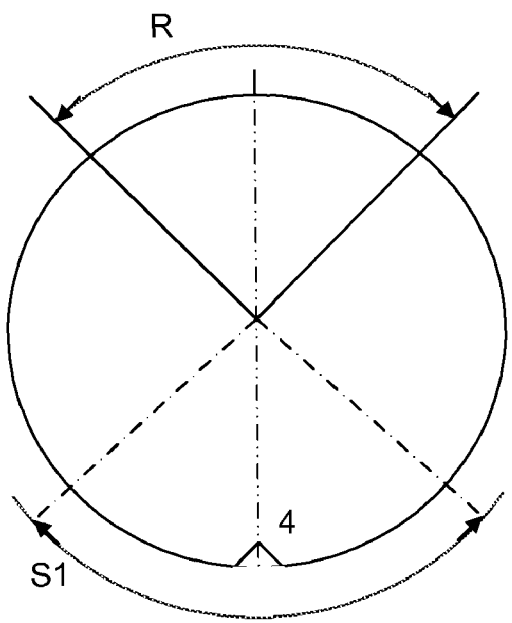
FIGS. 5A and 5B show schematically the orientation of the notch on the wafer relative to the splitting-wave initiation sector.

FIG. 5A shows a first favourable position of the notch 4 in a sector S1 diametrically opposite the splitting-wave initiation sector R (the bisectors of the sectors S1 and R forming a straight line, depicted by dot-dash lines), that is to say the approximately straight path of the splitting wave terminates close to the notch 4.

Figure 5B:
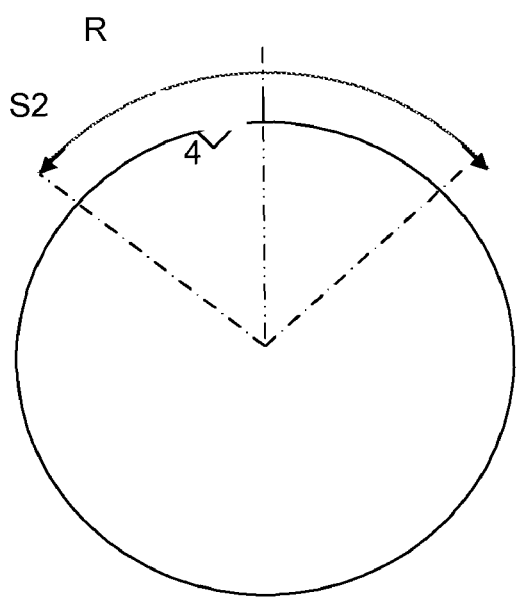

FIG. 5B shows a second favourable position of the notch 4 in a sector S2 centred on the sector R (the bisectors of the sectors S2 and R being coincident), that is to say the path of the splitting wave is initiated close to the notch 4.

In the case illustrated in FIG. 5B, in which the sector R and the sector S2 each correspond to a quadrant, these two sectors are therefore coincident.

In contrast, when the notch 4 is oriented at 90° to the bisector of the initiation sector R, in the usual practice, the splitting wave traverses the wafer, passing over the notch 4 but without either terminating in or being initiated at the latter, and causes a process line.

Figure 4:
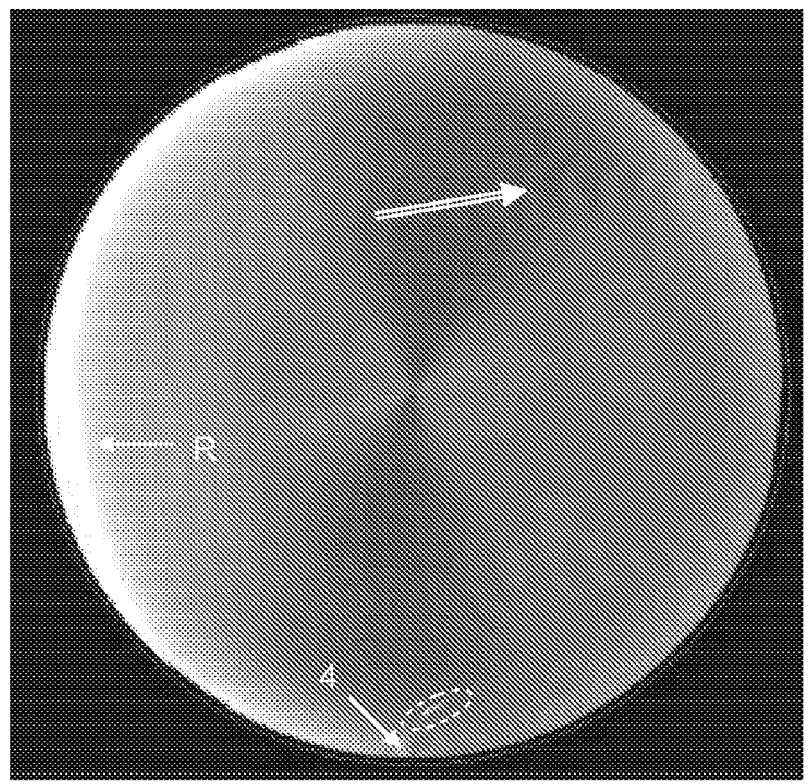
FIG. 4 is a photograph of the front of a splitting-wave initiated in a region oriented at 90° to the notch.

FIG. 4 illustrates this configuration, the visible process line being surrounded by dots.

However, the description is not in any way limited to a 0° orientation of the splitting-wave initiation as described above.

This is because it is possible to start the splitting wave at any point on the periphery of the wafer 1 (for example, in the case of splitting by means of annealing, by locally heating the sector in which it is desired to initiate the splitting).

Consequently, nor is the position of the notch 4 limited to the lower quarter or to the upper quarter of the wafer 1.

Furthermore, it can be noted that the direction of propagation of the splitting-wave is not fully controlled by a person skilled in the art.

This is because, starting from the same initiating point, it is observed that the splitting wave may propagate along different directions (with an angular amplitude of around 45°).

In this regard, the Applicant has observed that the orientation of the wafer in the implantation machine (to form the weakened zone) has an impact on the control of the splitting-wave initiation.

Figure 6:
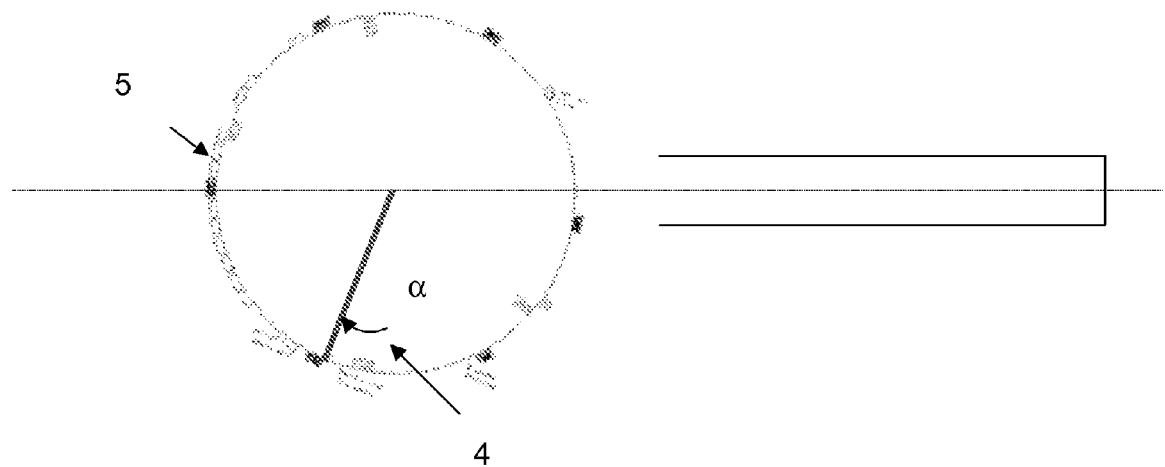
FIG. 6 illustrates schematically the fixed restraint device for holding the wafer in position during the implantation.

In the case of a "batch" implantation (i.e. simultaneous implantation of several wafers on a wheel), a fastening device 5 is used, as shown in FIG. 6, to keep the wafer in place.

The portion of the periphery of the substrate that is held by the fastening device is typically an angular sector of about 90°.

The fastening device is usually located diametrically opposite to the center of the wheel.

This device constitutes a thermal contact with the substrate and can therefore remove heat therefrom.

It also constitutes an electrical contact and thus allows the electric charges accumulated by the substrate during implantation to flow away.

The angle α defines the position of the notch 4 relative to the fastening device 5.

That portion of the periphery of the wafer in contact with the fastening device 5 during implantation must lie in the splitting initiation sector R, for example in the hot zone of the furnace in the case of thermal splitting.

In this configuration, the direction of propagation of the splitting wave in the initiation sector is better controlled, and therefore it is possible to ensure that the path of the wave is initiated or terminates in the vicinity of the notch so as to prevent the formation of the process line.

In other words, to achieve the combination of the above-mentioned requirements (namely, the position of the portion in contact with the fastening device relative to the splitting initiator sector, and the position of the notch relative to the splitting initiator sector), the notch must be located either in the portion of the wafer in contact with the fastening device or in a sector diametrically opposite to that portion.

More precisely, the process comprises the following steps:
fastening the substrate to the implantation wheel such that the notch is located either in a quarter of the periphery of the substrate diametrically opposite the fastening portion or in a quarter of the periphery of the substrate centred on the fastening portion (in the embodiment illustrated in FIG. 6, the notch is located at an angle α of, respectively, either 270°±45° or 90°±45°);
carrying out the implantation;
removing the substrate from the fastening device;
initiating the splitting wave in the portion of the wafer that was held by the fastening device.

By complying with the orientation defined above, it is possible to reduce the occurrence of the process line by a factor of at least 5, typically 7, compared with a method in which the notch is not located in the preferential sector S1 or S2 with respect to the splitting initiator, or even to prevent such a line appearing.

Figure 7:
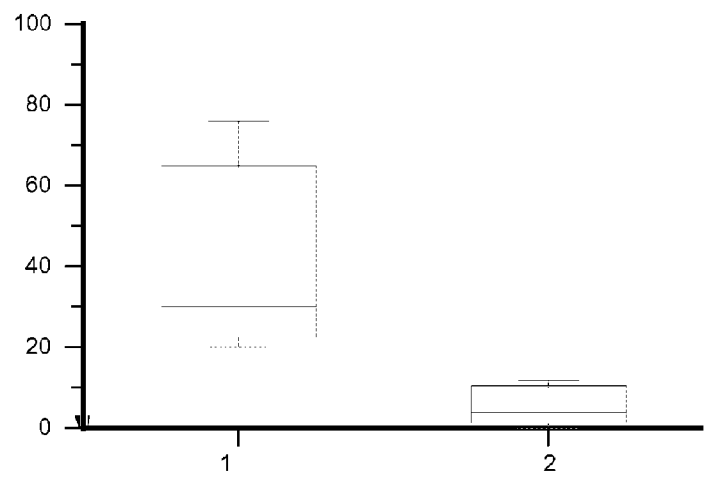
FIG. 7 shows the occurrence of the process line on batches of wafers fabricated respectively with a notch positioned unfavourably and favourably with respect to the splitting-wave initiation sector.

The invention therefore significantly increases the yield of the splitting step. FIG. 7 shows batches of wafers produced, some with an unfavourable orientation of the notch relative to the splitting initiator (series 1) and others with a favourable orientation of the notch (series 2).

The graphic in FIG. 7 illustrates the minimum, average and maximum occurrences (expressed as a percentage) of the process line in the two series of batches.

The average occurrence is reduced by a factor of close to 7.

In the most affected batches, close to 75% of the wafers may have a process line in the case of an unfavourable orientation, as opposed to 12% at most in the case of an orientation in accordance with the invention.

On average, a batch of 25 wafers obtained according to the invention has at most three wafers with a process line.

Finally, it should be pointed out that process lines not associated with the notch may remain on the periphery of the wafer, but these lines are shorter, rarely emergent and therefore less troublesome.

What is claimed is:

1. A process for splitting a semiconductor substrate having an identification notch on its periphery, which comprises:
creating a weakened zone in the substrate by implanting atomic species into the substrate while the substrate is held in place on a portion of its periphery during the implanting; and
splitting the substrate along the weakened zone by placing the held portion of the substrate in a splitting-wave initiation sector while positioning the notch, and by initiating a splitting wave followed by the propagation of the wave into the substrate,
wherein during splitting the notch is positioned so that it is in a quarter of the periphery of the substrate diametrically opposite the splitting-wave initiation sector for initiating the splitting wave or in the quarter of the periphery of the substrate that is centered on the splitting-wave initiation sector.

2. The process according to claim 1, wherein the sector quarter in which the notch lies is between 135° and 225° or between 315° and 45° to a bisector of the splitting-wave initiation sector.

3. The process according to claim 1, wherein the substrate is placed in a vertical position in a furnace during splitting, so that the splitting-wave initiation sector is centered on top of the substrate and in that the notch is located in one of the lower or upper quarter of the substrate.

4. The process according to claim 1, wherein the splitting wave is initiated by a mechanical stress applied in the splitting-wave initiation sector.

5. The process according to claim 1, wherein the substrate portion is held by a fastening device.

6. The process according to claim 1, wherein the splitting-wave initiation sector is a 90° sector.

7. The process according to claim 1, which further comprises directly bonding the substrate to a receiver substrate prior to splitting, such that a film defined in the substrate by the weakened zone is transferred to the receiver substrate.

8. A batch of split substrates having an identification notch, with each substrate of the batch being obtained by a process according to claim 1, wherein a proportion of substrates having a process line associated with the notch is less than 12%.

9. The process according to claim 1, wherein a proportion of the substrates having a process line associated with the notch is less than 12%.

10. The process according to claim 1, wherein during splitting the notch is positioned so that it is in the quarter of the periphery of the substrate diametrically opposite the splitting-wave initiation sector.

11. The process according to claim 1, wherein the splitting wave is initiated by a thermal stress differentially applied in the splitting-wave initiation sector.

* * * * *